(12) United States Patent
Ishihara

(10) Patent No.: US 6,272,568 B1
(45) Date of Patent: *Aug. 7, 2001

(54) METHOD FOR RECORDING INFORMATION ON A MEMORY

(75) Inventor: Hiroyuki Ishihara, Saitama-ken (JP)

(73) Assignee: Pioneer Electronic Corporation, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/069,795

(22) Filed: Apr. 30, 1998

(30) Foreign Application Priority Data

Apr. 30, 1997 (JP) .................................... 9-113190

(51) Int. Cl.[7] ........................... G06F 13/38; G06F 13/12; H03M 7/34; H03M 7/38; H04N 1/417

(52) U.S. Cl. ................................. 710/68; 710/65; 710/66; 382/232; 382/235; 382/239; 341/51; 345/202; 358/1.15; 358/261.2; 358/430

(58) Field of Search ................................ 341/110, 67, 51; 710/62–69; 702/62; 377/26; 369/84, 85, 58, 47; 382/245, 232, 235, 239; 345/202; 358/1.15, 261.2, 261.3, 262.1, 430, 449, 465

(56) References Cited

U.S. PATENT DOCUMENTS

| | | | |
|---|---|---|---|
| Re. 36,947 | * | 11/2000 | Wood et al. .......................... 395/115 |
| 5,194,995 | * | 3/1993 | Severtson et al. ...................... 360/48 |
| 5,210,829 | * | 5/1993 | Bitner ................................... 395/250 |
| 5,272,691 | * | 12/1993 | Watanabe ............................. 369/124 |
| 5,278,970 | * | 1/1994 | Pence .................................. 395/425 |
| 5,343,539 | * | 8/1994 | Chan .................................... 382/253 |
| 5,479,587 | * | 12/1995 | Campbell et al. .................... 395/116 |
| 5,533,051 | * | 7/1996 | James .................................. 375/240 |
| 5,535,356 | * | 7/1996 | Kim et al. ............................ 711/103 |
| 5,561,824 | * | 10/1996 | Carreiro et al. ....................... 710/52 |
| 5,574,952 | * | 11/1996 | Brady et al. ........................... 710/68 |
| 5,577,134 | * | 11/1996 | Westerink ............................ 382/240 |
| 5,594,598 | * | 1/1997 | Shikakura ............................. 360/49 |

(List continued on next page.)

Primary Examiner—Thomas Lee
Assistant Examiner—Tanh Nguyen
(74) Attorney, Agent, or Firm—Arent Fox Kintner Plotkin & Kahn, PLLC

(57) ABSTRACT

A reference value is set for recording quantity of information, and a plurality of compression factors is provided for compressing information to be recorded. The compression factors are arranged in order. The information is sequentially recorded on a first memory at a first compression factor of the arrangement of the compression factors. It is determined whether the recording quantity of a first information group reaches the reference value. The first information group is compressed at a larger second compression factor when the recording quantities reaches the reference value, and the compressed first information group is recorded on the first memory at a first area. A second information group following the first information group is compressed at the second compression factor, and the compressed second information group is recorded on the first memory at a second area next to the first area. It is determined whether the sum of the recorded first and second information groups reaches the reference value. The recorded first and second information group are compressed at a further larger third compression factor. The compression of the information groups at succeeding compression factors and recording of the compressed information groups are repeated until end of the information to be recorded.

4 Claims, 7 Drawing Sheets

U.S. PATENT DOCUMENTS

| | | | |
|---|---|---|---|
| 5,652,830 | * | 7/1997 | Yamamoto et al. ................. 395/115 |
| 5,671,389 | * | 9/1997 | Saliba ................................... 711/111 |
| 5,734,892 | * | 3/1998 | Chu ..................................... 707/101 |
| 5,832,443 | * | 11/1998 | Kolesnik et al. .................... 704/500 |
| 5,852,710 | * | 12/1998 | Shiohara et al. ..................... 395/115 |
| 5,933,845 | * | 8/1999 | Kopp et al. .......................... 711/103 |
| 6,000,009 | * | 12/1999 | Brady .................................. 711/112 |
| 6,061,473 | * | 5/2000 | Chen et al. .......................... 382/235 |

* cited by examiner

FOURTH REFERENCE VALUE

THIRD REFERENCE VALUE

SECOND REFERENCE VALUE

FIRST REFERENCE VALUE

FIRST REFERENCE VALUE
SECOND REFERENCE VALUE

THIRD REFERENCE VALUE

FOURTH REFERENCE VALUE

METHOD FOR RECORDING INFORMATION ON A MEMORY

BACKGROUND OF THE INVENTION

The present invention relates to a method for recording information on a memory such as a so-called PC card provided with a semiconductor memory.

A tape recorder which uses such principle that information causes variation in magnetization has been widely used for recording audio information. Recently, there has been known and actually used another recording system using a memory card. The memory card, which is often referred to as a PC card, is provided with a semiconductor memory and has a size about a calling card.

The PC card comprises integrated elements such as the semiconductor memory, transistors, capacitors, and resistors. The semiconductor memories can be roughly categorized into a bipolar memory and a MOS memory. The bipolar memory is more advantageous than the MOS memory in that it requires less access time. However, larger power is consumed, and in addition, causes a larger heat radiation. To the contrary, the MOS memory requires a longer access time, but involves less power consumption and heat radiation. The semiconductor memory with a large capacity is usually a MOS memory.

Referring to FIG. 7, a conventional recording and reproducing system for the PC card comprises a CPU 1, audio interface 2, key interface 3, display interface 4, and a memory card interface 5. The audio interface 2 is applied with digital audio information through a DIR 7, and analog audio information through an A/D converter 8. The digital information is transmitted from the recording and reproducing system through a D/A converter 9. The key interface 3 is connected with a key matrix 10 for the user to input various information, and the display interface 4 is connected to a liquid crystal display 11 on which various information is shown. A PC card 12 is detachably connected to the memory card interface 5 so that the desired information is recorded on the card and read out therefrom. The information may further be erased from the PC card 12. The CPU 1 and the interfaces 2 to 5 are connected to each other through a system bus 6, and the interfaces 2 to 5 are connected to respective peripheral equipments 7 to 12 through the system buses 6.

The recording and reproducing system is further provided with a ROM 13 and a RAM 14. The ROM 13 stores a program for controlling the operation of the entire system. When the power of the system is turned on, the program in the ROM 13 is stored in the RAM 14 which is a main memory, thereby starting a predetermined operation. Namely, the interfaces 2 to 5 are initialized and the operations thereof checked. Hence the system is ready for operation which is started by operating the key matrix 10.

In operation, when a predetermined switch is turned on, the CPU 1 executes the program stored in the ROM 13. Information applied through the audio interface 2 is temporarily stored in the RAM 14, or in a separately provided buffer RAM, and thereafter, recorded on the PC card 12. The recorded information can be reproduced when a command signal is applied from the CPU 1. Various information is indicated on the display 11 during the operation.

In order to record a large quantity of information on the PC card 12, information may be compressed as necessary. The compressed information is directly recorded on the PC card 12. Alternatively, the uncompressed information corresponding to one block is stored in the RAM 14 or the buffer RAM, and thereafter, the block of information is compressed and written on the PC card 12. In the latter method, the compression and the recording are repeated until the necessary information are written on the PC card 12.

A compression factor at the compression is calculated as follows. When the sampling frequency when the information is not compressed is 48 kHz, which is the same as in the case of recording a digital audio tape (DAT), and one word corresponds to 16 bits, one channel bit rate (br) is 768 kbps/ch. Since $$br=fs*w,$$

$$br=48\ (kHz)*16\ (bit)=768\ kbps/ch$$

The equation applies to a case of a recording with one channel so that at a stereophonic recording, the value is doubled. Hence the compression factor is calculated in accordance with, $$br=fs*w=M/2t$$

wherein M is the storage capacity of the PC card 12, and t is the recording time. The numeral 2 in the denominator indicates that the compression factor is applied to a stereophonic recording.

For example, when the PC card 12 has a storage capacity of 40 MB (10M word/stereophonic recording), the time capable of recording on the PC card at each compression factors is as follows. When the information is not compressed, the recording time is 208 sec/stereophonic recording. When the compression factor is ½, the recording time is 416 sec/stereophonic recording, when the compression factor is ⅓, 624 sec/stereophonic recording, and when ⅙, 1248 sec/stereophonic recording. The compression is carried out in accordance with various conventional methods which have been developed and used, so that the detailed descriptions thereof are omitted.

In such a recording and reproducing system, when the quantity of the information to be recorded, that is the length of recording time, is known beforehand, the user can select a PC card having a sufficient storage capacity, or determine an appropriate compression factor dependent on the storage capacity of the PC card. Hence, the information can be recorded from the beginning to the end without fail. However, when the length of the information is unknown, such as when recording every statement made during a conference, there may be cases where the conventional system cannot record the conference to the end. The entire conference can be recorded if a system using a large compression factor is employed. However, when the information is recorded at a large compression factor, the deterioration in sound quality inevitably occurs. Although the recording of a conference does not require a superior sound quality, the large compression factor may cause error at reproduction. Thus, it is preferable to maintain the compression factor as small as possible.

In addition, there may be a case where the recording time is unexpectedly short so that the PC card still has a large storage capacity left when the recording is over. Since the user do not think of using the same PC card when recording another information, the remaining storage capacity is wasted.

Namely, although there still may be a storage capacity left in the PC card, the user does not usually use the card when recording information of indefinite length. The user will use a new PC card instead. Hence in a system where the compression factor can be set at various levels, when the information is recorded at the largest compression factor, the length of the recording information may be unexpectedly short so that the storage capacity of the PC is wasted, which is undesirable. In order to prevent such a waste, the information on the PC card is re-recorded on another PC card so as to enable the information on the original PC card to be erased, or another information to be written over the old. Such an operation is troublesome.

SUMMARY OF THE INVENTION

An object of the present invention is to provide a method and a system for recording information on a PC card where the storage capacity thereof is effectively utilized, and the information of indefinite length is recorded to the end without fail.

According to the present invention, there is provided a method for recording information on a memory comprising the steps of, setting a reference value for recording quantity of information, providing a plurality of compression factors for compressing information to be recorded, sequentially recording the information on a first area of a first memory at a first compression factor, determining whether a recorded quantity of a first information group reaches the reference value, compressing a second information group following the first information group at a second compression factor when the recorded quantity of the first information group reaches the reference value, recording the compressed second information group on the first memory on a second area, determining whether the recorded quantity of the second information group recorded in the second area reaches the reference value, compressing a third information group at a third compression factor when the recorded quantity reaches the reference value, repeating the compression of the information groups at succeeding compression factors and recording of the compressed information groups until end of the information to be recorded.

The compressed information groups are finally recorded in a desired second memory.

The first memory is a desired second memory.

The compression factor is increased at every change of the compression factor.

DETAILED DESCRIPTION OF THE PREFERRED EMBODIMENT

Figure 7:
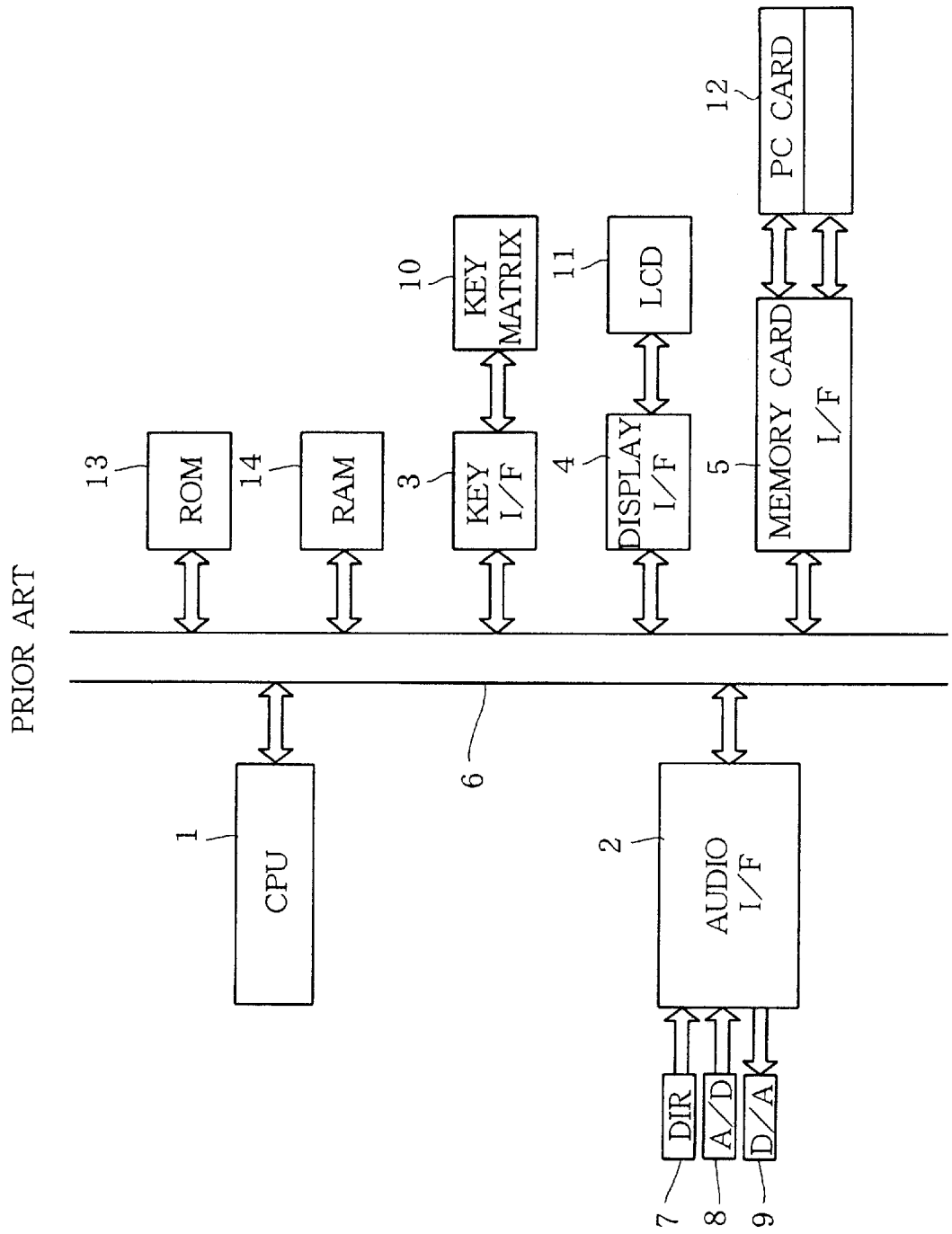
FIG. 7 is a block diagram showing a conventional recording and reproducing system for the PC card.

The recording system for recording information on a PC card to which the present invention is applied, has the same basic construction as the system shown in FIG. 7. Namely, the system for the PC card comprises the CPU 1, audio interface 2, key interface 3, display interface 4, and the memory card interface 5. The audio interface 2 is applied with digital audio information through the DIR 7, and analog audio information through the A/D converter 8. The digital information is transmitted from the recording and reproducing system through the D/A converter 9. The key interface 3 is connected with the key matrix 10 for the user to input various information, and the display interface 4 is connected to the liquid crystal display 11 on which various information is shown. The PC card 12 is detachably connected to the memory card interface 5 so that the desired information is recorded on the card and read out therefrom. The information may further be erased from the PC card 12. The CPU 1 and the interfaces 2 to 5 are connected to each other through the system bus 6, and the interfaces 2 to 5 are connected to respective peripheral equipments 7 to 12 through the system buses 6.

The recording and reproducing system is further provided with the ROM 13 and the RAM 14. The ROM 13 stores a program for controlling the operation of the entire system. When the power of the system is turned on, the program in the ROM 13 is stored in the RAM 14 which is a main memory, thereby starting a predetermined operation. Namely, the interfaces 2 to 5 are initialized and the operations thereof checked. Hence the system is ready for operation which is started by operating the key matrix 10.

In operation, when a predetermined switch is turned on, the CPU 1 executes the program stored in the ROM 13. Information applied through the audio interface 2 is temporarily stored in the RAM 14, or in a separately provided buffer RAM, and thereafter, recorded on the PC card 12. The recorded information can be reproduced when a command signal is applied from the CPU 1. Various information is indicated on the display 11 during the operation.

Figure 1:
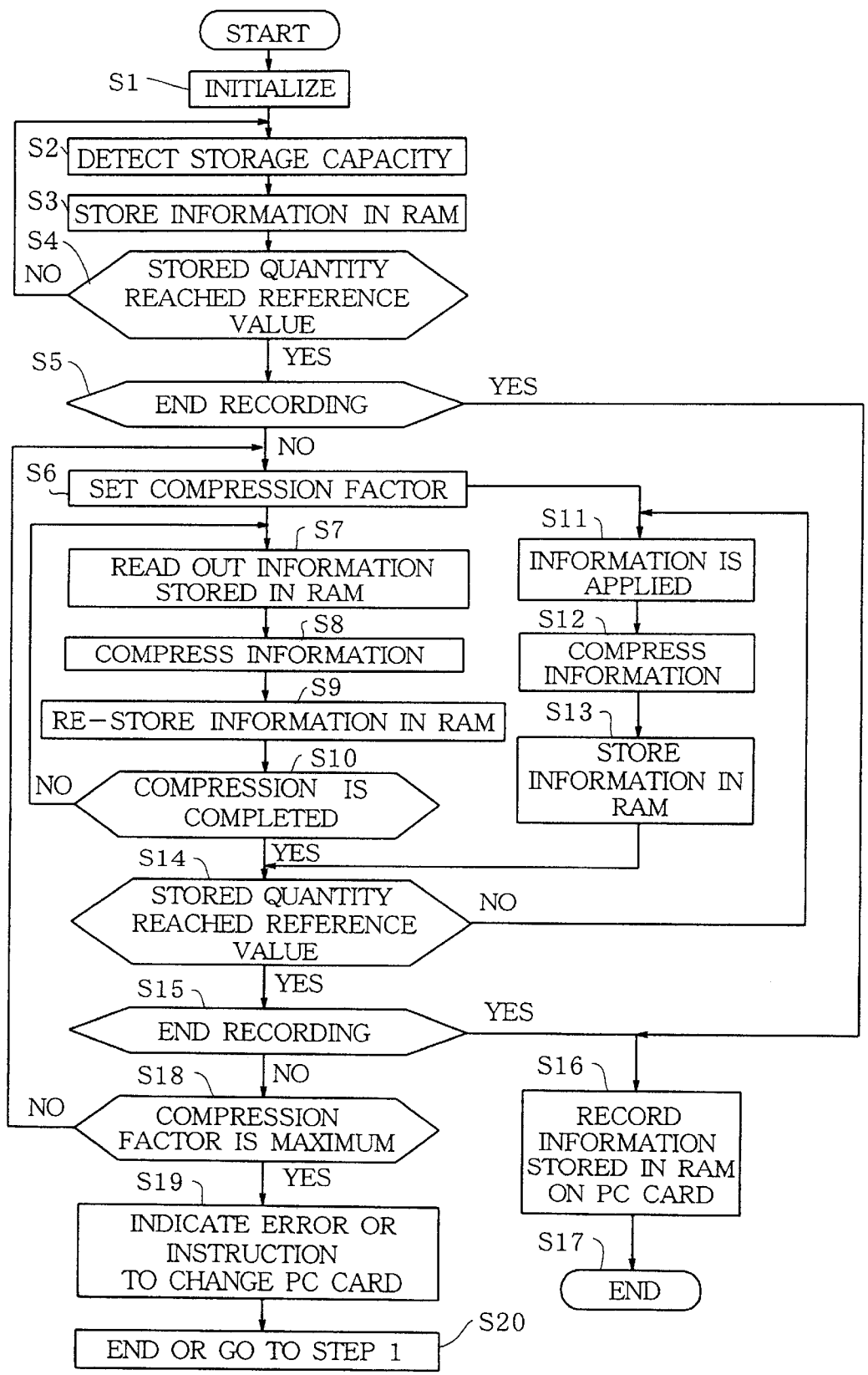
FIGS. 1 to 3 are flowcharts describing the operations of various embodiments of a system for recording information on a PC card according to the present invention.

The operation of the first embodiment of the present invention will be described hereinafter with reference to FIG. 1. In the system of the first embodiment, a buffer RAM is provided in addition to the devices shown in FIG. 7. The storage capacity of the buffer RAM is the same as, or larger than that of the PC card 12. A predetermined reference value, which corresponds to the storage capacity of the PC card 12, is set in the buffer RAM.

With the turning on of a predetermined switch, the initialization is carried out at a step S1, where the program stored in the ROM 13 is executed by the CPU 1. The program of the present embodiment is adapted to execute compression of information at six levels. Namely, the compression factor can be chosen from 1, that is when information is not compressed, $\frac{1}{2}$, $\frac{1}{3}$, $\frac{1}{4}$, $\frac{1}{6}$, and $\frac{1}{12}$.

The PC card 12 is loaded through an opening (not shown) of the system. The system detects whether the PC card 12 is loaded, and indicates the result on the display 11.

When the PC card 12 is correctly loaded, the program goes to a step S2 where the storage capacity of the PC card 12 is detected and stored in the RAM 14. If the PC card 12 already has information written on it, the remaining capacity is detected. In such a case, the new information is recorded following the already recorded information. However, with the operation of the key matrix 10, the new information can be written over the recorded information. The storage capacity of the PC card 12 in consideration to the operation of the keys is shown on the display 11. For the convenience of the user, the display 11 may further show the possible recording time when each of the six compression rates is selected. The recording time can be input by operating the key matrix 10 if it is known to the user.

At a step S3, the information to be recorded is applied through a microphone or through an input terminal and written in the buffer RAM. At this time, the compression of information is not executed. Thereafter, at a step S4, the CPU 1 determines whether the quantity of the recorded information reaches the reference value, which is the capacity corresponding to one block of the buffer RAM. When the recorded quantity is smaller than the reference value, the program returns to the step S2 to continue to temporarily store the information in the buffer RAM.

If the quantity of the recorded information reaches the reference value, the program goes from the step S4 to a step S5 where the operation of the key matrix 10 for ending the recording is detected. When the recording is to be ended, the program jumps to a step S16 where the information stored in the buffer RAM is recorded on the PC card 12 without compressing. Thereafter, the program is ended at a step S17.

When the matrix key 10 is not operated at the step S5 so that the recording is to be continued, the program proceeds to a step S6 where the compression factor is raised one level. Namely, in the first routine, since the compression is not carried out, the compression factor is now set at the first compression factor of ½. At a step S7, the information stored in the buffer RAM is read out, at a step S8, the read out information is compressed, and at a step S9, the compressed information is again stored in the buffer RAM. At a step S10, it is determined whether the compression at the determined compression factor is completed. If the compression is completed, the program goes to a step S14, and if not, the steps S7 through S9 are repeated.

During the operation of the steps S7 to S10, another operation of steps S11 through S13 is carried out. Namely, at the step S11, the information to be recorded continues to be applied through the microphone or the input terminal as at the step S2. At the step S12, the applied information is compressed at the compression factor determined at the step S6, and stored in the buffer RAM at the step S13.

At the step S14, it is determined whether the sum of the quantities of the compressed information recorded at the steps S9 and S13 reaches the reference value. If the recorded quantity does not yet reach the reference value, the program returns to the step S11 to continue the recording.

If the recorded quantity reaches the reference value, it is determined whether the key matrix 10 is operated to end the recording at a step S15. When the recording is to be ended, the program goes to the step S16. On the other hand, when the recording is to be continued, the program goes to a step S18 to determine whether the compression factor set at the step S6 is the maximum factor of ¹⁄₁₂, that is whether the compression is carried out at the maximum compression factor at the steps S8 and S12. If the present compression factor is not the maximum factor, the program goes back to the step S6. More particularly, in the first routine, since the compression factor is the first factor of ½, the program returns from the step S18 to the step S6 where the second compression factor, ⅓, is determined. The steps S6 to S18 are repeated until the recording is completed, or the maximum compression factor is selected.

When it is determined at the step S18 that the compression is carried out at the maximum compression factor, it means there is an error, or the PC card 12 is full. Accordingly, an error sign or an instruction to exchange the PC card 12 for another is shown on the display 11 at a step S19. Thereafter, the program is ended at a step S20 in the case of error, or returns to the step S1 when the PC card 12 is changed.

Thus in accordance with the present invention, the compression factor is gradually changed depending on the length of the information to be recorded. Thus the PC card is effectively utilized without wasting the remaining storage capacity, and the information can be recorded to the end. The present invention may be applied both to the MOS memory and the bipolar memory.

The present embodiment may be so modified that the compression factor is initially set at the maximum factor of ¹⁄₁₂. Hence at the step S6, the compression factor is gradually decreased. At the step S18, it is determined whether the minimum compression factor is set, and when the compression factor is larger than the minimum factor, the compression factor is decreased one level at a time in the following routines. However, the modification is inferior than the first embodiment in that, since the maximum compression factor is initially determined, the quality of the signal at reproduction is inevitably deteriorated.

Figure 2:
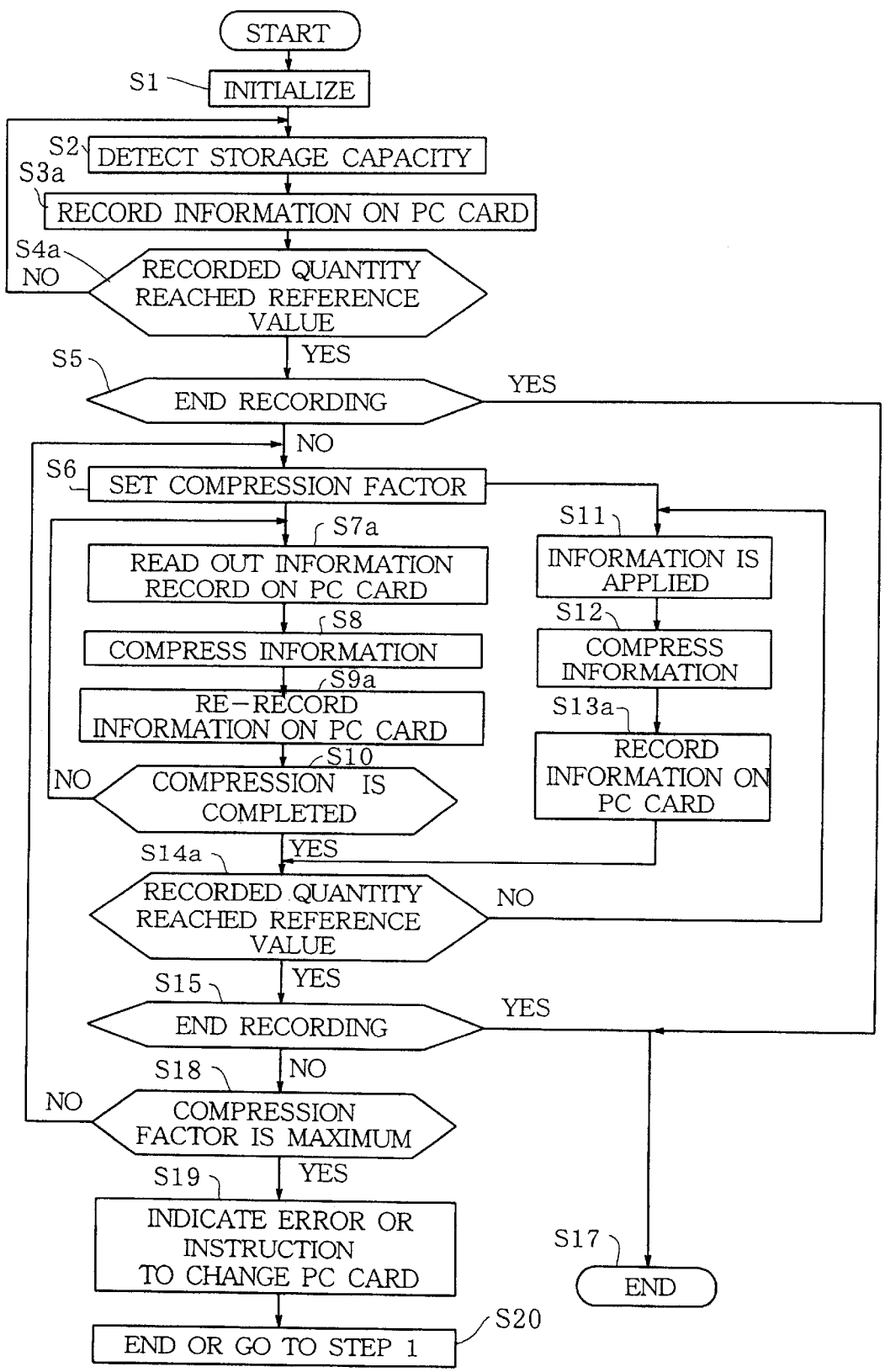

The recording system of the second embodiment of the present invention, the operation of which is described in FIG. 2, is not provided with the buffer RAM. Hence the information is directly recorded on the PC card 12.

Referring to FIG. 2, after the system is initialized at the step S1, and the storage capacity of the PC card 12 is detected at the step S2, the recording of the information on the PC card 12 is carried out at a step S3a. The quantity of the recorded information is compared at a step S4a with a predetermined reference value, which is an arbitrary value smaller than the storage capacity of the PC card 12. When the quantity of the recorded information reaches the reference value, the information already recorded on the PC card is read out at a step S7a, compressed at the step S8 at the compression factor determined at the step S6, and re-recorded on the card at a step S9a.

At the same time, the information applied at the step S11, is compressed at the step S12 and recorded on the PC card 12 at a step S13a.

The compression factor is increased every time the quantity of information recorded on the PC card 12 reaches the reference value at a step S14a. When the quantity of information compressed at the maximum compression factor and recorded on the PC card 12 reaches the reference value, the error sign or the instruction to change the PC card 12 is indicated on the display 12. Other operations are the same as those of the first embodiment.

The second embodiment may also be modified in the same manner as the first embodiment as described above so that the compression factor is gradually decreased.

Figure 3:
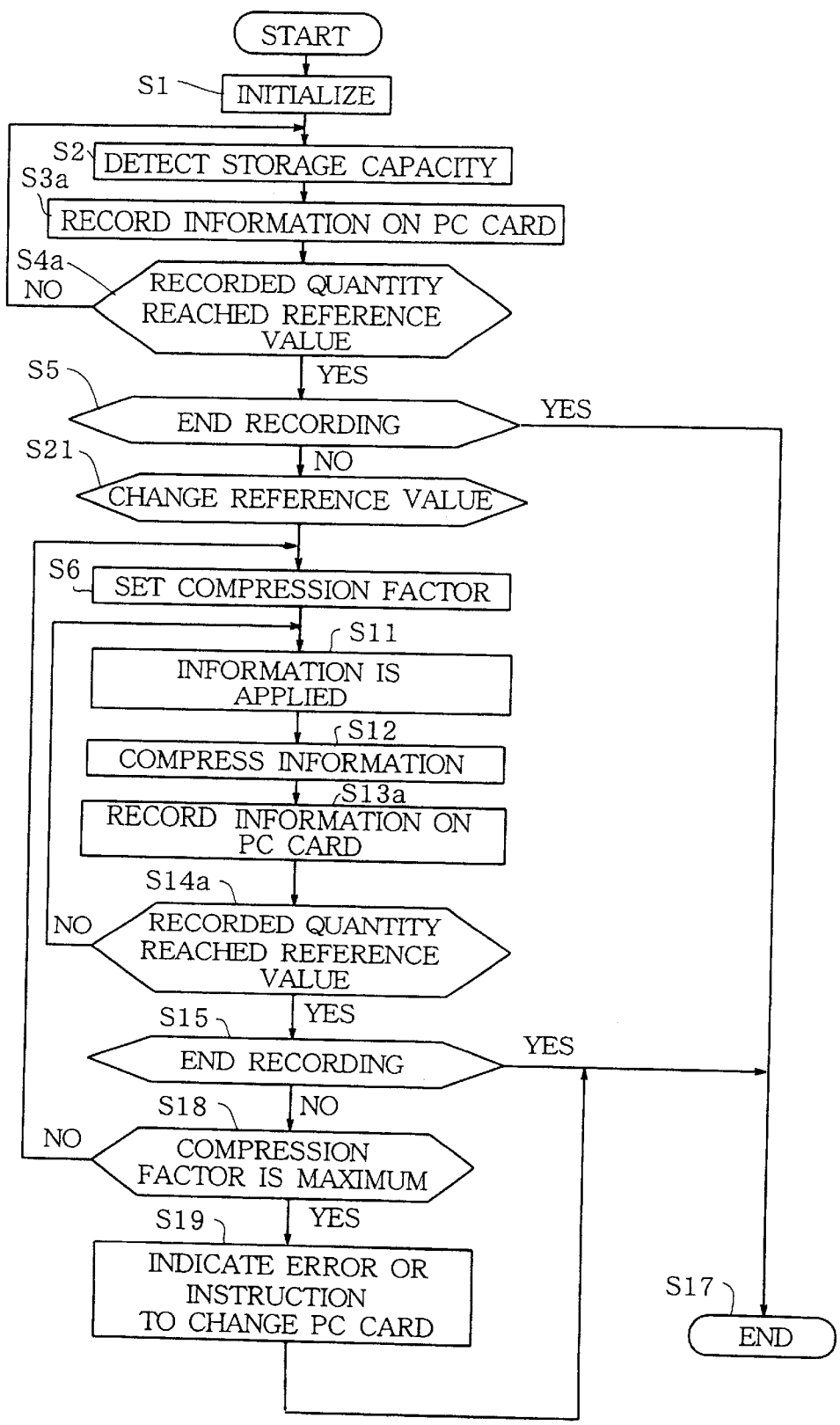
Figure 4:
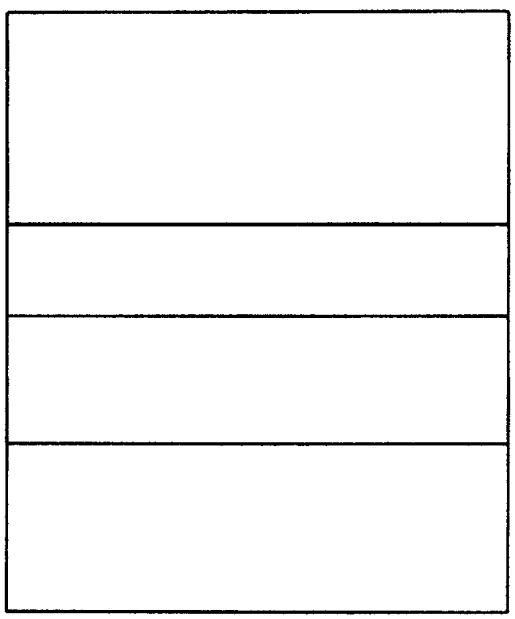
FIG. 4 is an illustration explaining reference values of quantity of information recorded on the PC card in the embodiment described in FIG. 3.
Figure 5:
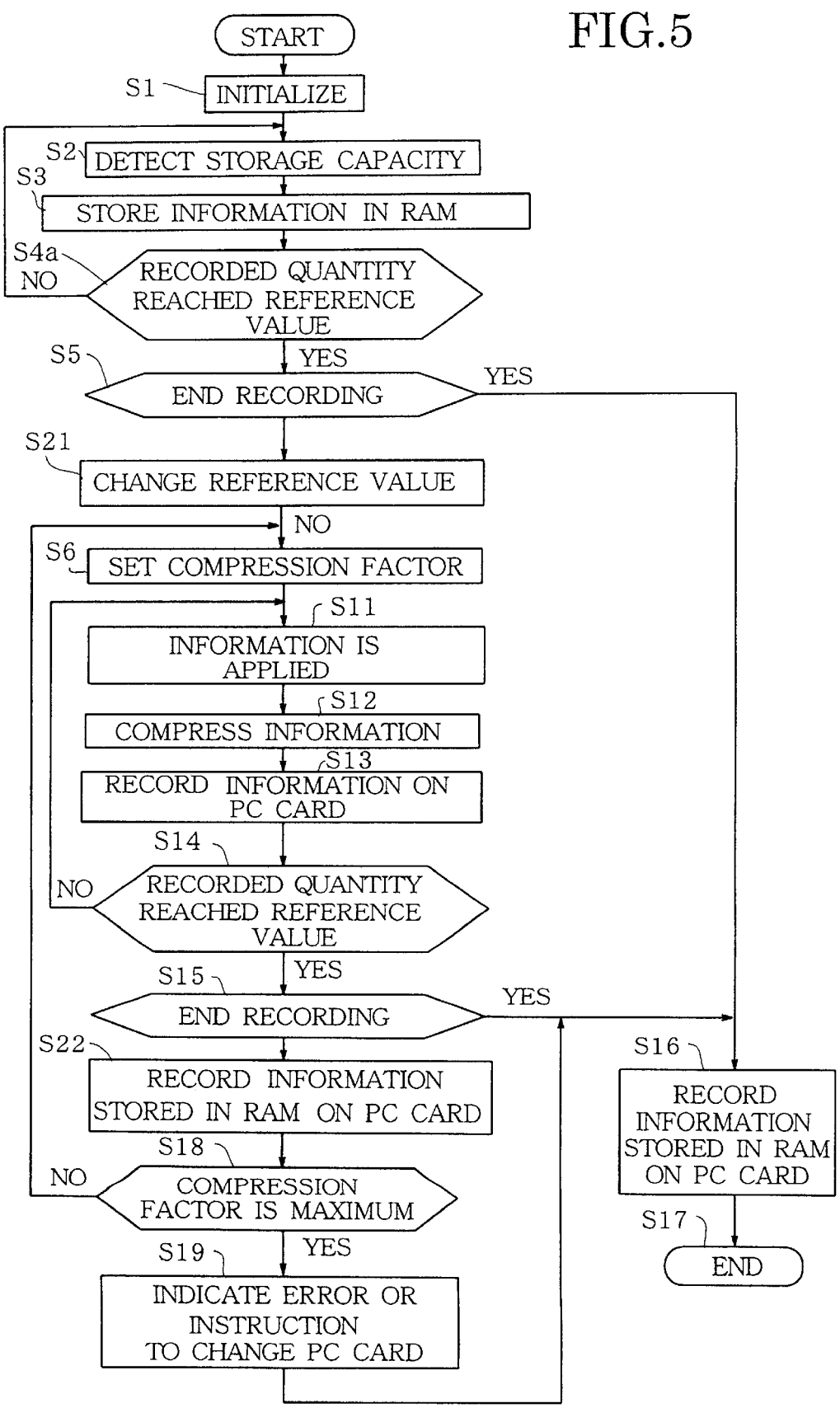
FIG. 5 is a flowchart describing the operation of another embodiment of the recording system.

In the third embodiment described in FIG. 3, four reference values of the recording quantity are predetermined as shown in FIG. 4.

Namely, when it is determined at the steps S4a and S5 that the quantity of the recorded information reaches the initially set first reference value, and the recording is to be continued, the reference value is changed from the first value to the larger second value at a step S21. Thereafter, at the step S6, the compression factor is also set to the first compression factor of ½.

The information which is applied thereafter at the step S11 is compressed at the increased compression factor at the step S12 and recorded on the PC card at the step S13a. When the quantity of the recorded information reaches the second reference value at the step S14a, the program returns to the step S6 where the second compression factor ⅓ is set. The operation is repeated until the compression at the maximum compression factor is carried out.

The third embodiment may be further modified to gradually decrease the compression factor and the reference value.

The fourth embodiment is similar to the third embodiment except that the recording system is provided with the buffer RAM as in the first embodiment. Hence the information temporarily stored in the buffer RAM is recorded on the PC card 12 without compression at the step S16 when the recording is to be ended. The information is further recorded on the PC card 12 at a step S22 before increasing the compression factor.

Figure 6:
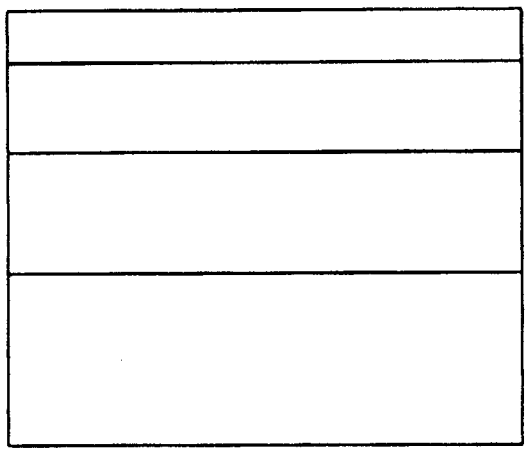
FIG. 6 is an illustration explaining reference values of quantity of information recorded on the PC card in the embodiment described in FIG. 5.

The first to fourth reference values in the fourth embodiment are predetermined as shown in FIG. 6.

The fourth embodiment may also be modified to decrease the reference value and the compression factor.

The present invention may be applied not only when recording audio information but also when recording visual signals. The recording system may be a stand-alone recording device, or may be attached to other audio devices.

From the foregoing it will be understood that the present invention provides a method and a system for recording information on the PC card wherein the compression factor is changed dependent on the length of the information so that the storage capacity of the PC card is effectively utilized and the information is recorded to the end. Hence such inconveniences as the wasting of the remaining capacity of the PC card are prevented while recording the entire desired information.

While the invention has been described in conjunction with preferred specific embodiment thereof, it will be understood that this description is intended to illustrate and not limit the scope of the invention, which is defined by the following claims.

What is claimed is:

1. A method for recursive compression of streaming data of indefinite length, the method comprising:

a) recording continuous data from streaming data of indefinite length on a first memory area at a compression factor until the streaming data of indefinite length ends or until the amount of the first memory utilized to store data reaches a predetermined reference value;

b) upon reaching the reference value, setting a next compression factor, wherein the next compression factor is different than the previous compression factor;

c) reading out the stored data, and then recording the read out data back to the first memory area at the next compression factor;

d) in conjunction with step c, continuing to record additional continuous data from the streaming data of indefinite length on a first memory area at the next compression factor until the streaming data of indefinite length ends or until the amount at the first memory utilized to store the combined recorded data reaches a predetermined reference value; and e) repeating steps b, c, and d until the streaming data of indefinite length ends or all the compression factors have been utilized.

2. The method according to claim 1 wherein the compression factor gradually increases.

3. The method according to claim 1 wherein the compressed information in the first memory area is finally recorded in a desired second memory area.

4. The method according to claim 1 wherein the reference value is set based on a storing capacity in the first memory area.

* * * * *